United States Patent
Kawai

(10) Patent No.: US 6,737,945 B2
(45) Date of Patent: May 18, 2004

(54) DIGITAL BROADCAST RECEIVING TUNER SUITABLE FOR MINIATURIZATION BY PLACING TUNER UNITS ON OPPOS SURFACES ON A BOARD

(75) Inventor: Satoshi Kawai, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 84 days.

(21) Appl. No.: 10/001,624

(22) Filed: Oct. 24, 2001

(65) Prior Publication Data

US 2002/0050876 A1 May 2, 2002

(30) Foreign Application Priority Data

Oct. 26, 2000 (JP) .......................... 2000-332143

(51) Int. Cl.[7] .................. H05K 1/11; H05K 11/00
(52) U.S. Cl. .................. 334/85; 361/760; 174/260; 455/189.1; 455/191.1
(58) Field of Search .......... 334/85; 333/185; 361/760; 174/260; 455/189.1, 191.1

(56) References Cited

U.S. PATENT DOCUMENTS 4,772,862 A * 9/1988 Kubo et al. ............... 333/185

FOREIGN PATENT DOCUMENTS

| JP | 33702 | * 2/1985 | ............... 333/185 |
| JP | A2 8-237154 | 9/1996 | |
| JP | A1 10-290055 | 10/1998 | |

* cited by examiner

Primary Examiner—Benny Lee
(74) Attorney, Agent, or Firm—Brinks Hofer Gilson & Lione

(57) ABSTRACT

A low-priced digital broadcast receiving tuner suitable for miniaturization will be provided. According to the present invention, it is possible to provide a low-priced digital broadcast receiving tuner having higher productivity as well as a less number of components than a conventional tuner because, on one surface of an insulating board, there is formed a first tuner while, on the other surface thereof, there is formed a second tuner, and therefore a single insulating board can be shared.

6 Claims, 2 Drawing Sheets

DIGITAL BROADCAST RECEIVING TUNER SUITABLE FOR MINIATURIZATION BY PLACING TUNER UNITS ON OPPOS SURFACES ON A BOARD

BACKGROUND OF THE INVENTION

1. Field of the Invention

The present invention relates to a preferred digital broadcast receiving tuner for use with a television set with a VCR or the like.

2. Description of the Prior Art

In a conventional digital broadcast receiving tuner, for example, a digital broadcast receiving tuner for use with a television set with a VCR, two tuners of a tuner for television and a tuner for a VCR are individually prepared respectively, and these two tuners are attached to a mother board respectively.

Thus, telecasting is adapted to be received by a tuner for a television, while the telecasting is picture-recorded by a tuner for a VCR, and the tuner for a VCR is adapted to, while receiving television by the tuner for a television, be able to picture record broadcast through the same channel or another channel.

The conventional digital broadcast receiving tuner cannot be miniaturized partly because two tuners are individually manufactured, which causes low productivity and high cost, and partly because those two tuners are installed side by side on one surface of a mother board, which increases the size of the mother board area that is used for mounting the tuners.

SUMMARY OF THE INVENTION

Thus it is an object of the present invention to provide a low-priced digital broadcast receiving tuner suitable for miniaturization.

As a first solution to the above-described problem, a structure is arranged such that the digital broadcast receiving tuner has an insulating board provided with a wiring pattern each on both surfaces thereof, and that on one surface of this insulating board there is formed a first tuner while on the other surface thereof there is formed a second tuner.

Also, as a second solution, the insulating board is structured of a stacked multi-layer board, and the structure is arranged such that the first and second tuners are electrically shielded from each other by a grounding conductor layer provided within the multi-layer board.

Also, as a third solution, a structure is arranged such that the first and second tuners have a high-frequency unit and a demodulation unit respectively, and that the high-frequency unit of the first tuner and the demodulation unit of the second tuner, and the demodulation unit of the first tuner and the high-frequency unit of the second tuner are arranged at a position opposite to each other with the multi-layer board interposed therebetween respectively.

Also, as a fourth solution, a structure is arranged such that the multi-layer board is formed of at least three layers; between the lamination layers, there are provided at least the two grounding conductor layers; in a region in which the high-frequency unit is provided, the grounding conductor layers arranged near the high-frequency unit are provided with a deletion unit; and in a range in which the demodulation unit is provided, the grounding conductor layers arranged near the demodulation unit are provided with a first remainder to thereby increase a facing distance between the wiring pattern of the high-frequency unit and the first remainder.

Also, as a fifth solution, a structure is arranged such that the high-frequency unit has an IC component having a direct conversion unit including an oscillator and a mixer, and that the grounding conductor layer arranged near the high-frequency unit is provided with a second remainder to oppose a lower portion of the IC component.

DETAILED DESCRIPTION OF THE PREFERRED EMBODIMENTS

Figure 1:
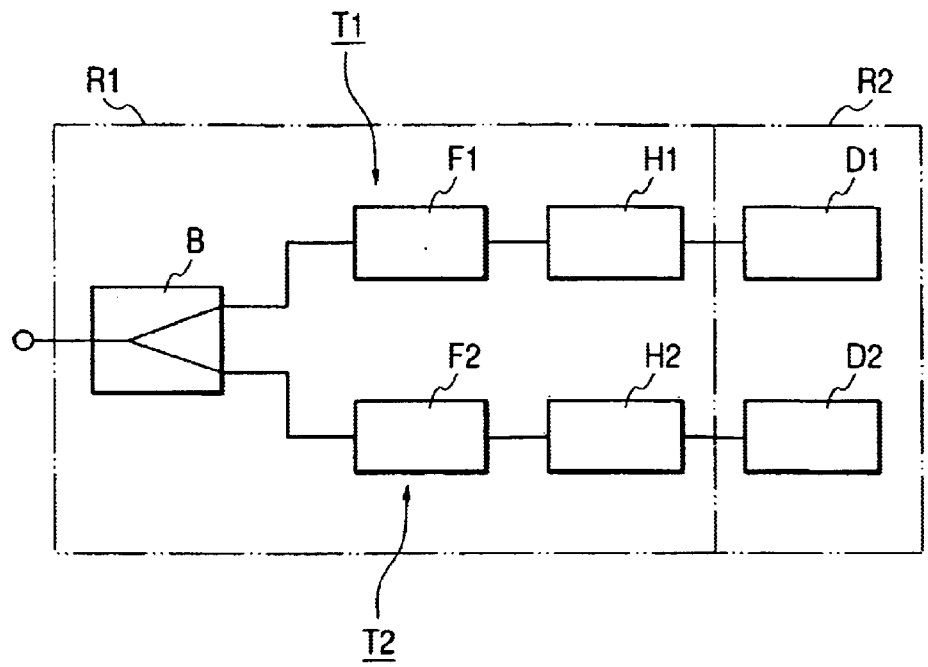
FIG. 1 is a block diagram showing a digital broadcast receiving tuner according to the present invention.
Figure 2:
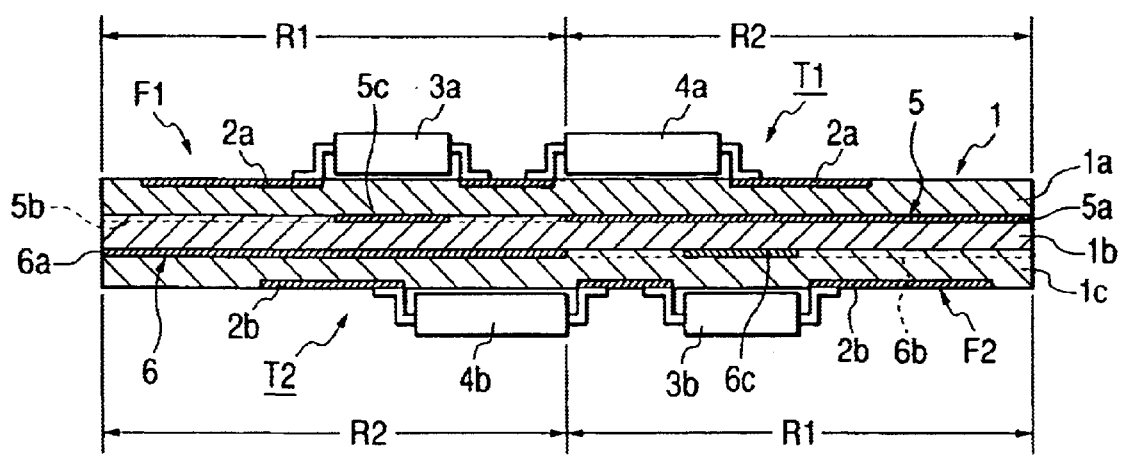
FIG. 2 is an enlarged cross-sectional view for a principal part showing an outline of the digital broadcast receiving tuner according to the present invention.
Figure 3:
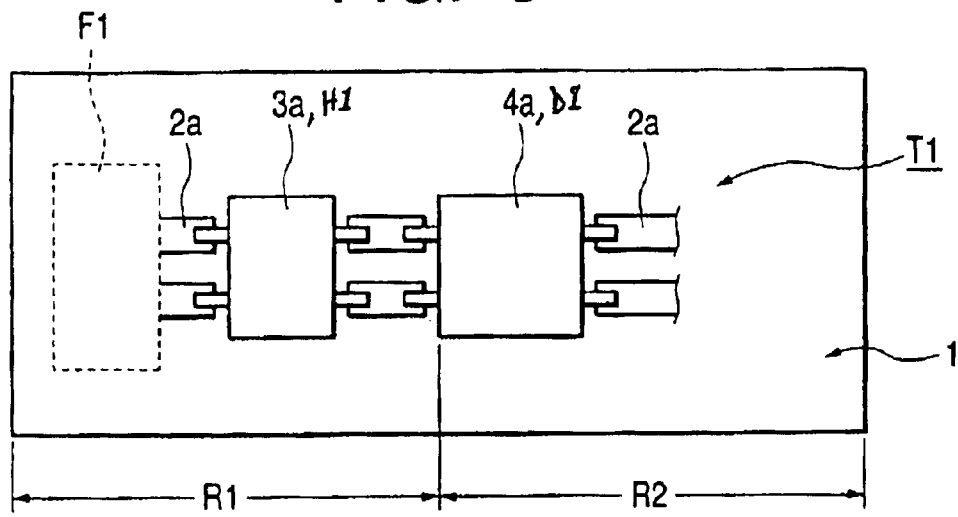
FIG. 3 is an enlarged plan view for a principal part showing an outline of the digital broadcast receiving tuner according to the present invention.
Figure 4:
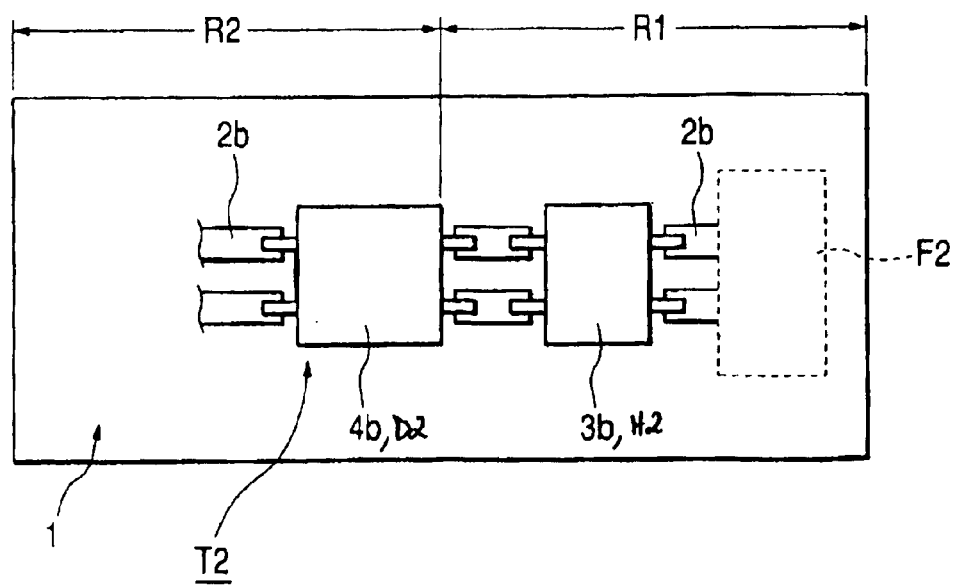
FIG. 4 is an enlarged bottom view for a principal part showing an outline of the digital broadcast receiving tuner according to the present invention.

A description will be made of the drawings of the digital broadcast receiving tuner according to the present invention. FIG. 1 is a block diagram showing a digital broadcast receiving tuner according to the present invention, FIG. 2 is an enlarged cross-sectional view for a principal part showing an outline of the digital broadcast receiving tuner according to the present invention, FIG. 3 is an enlarged plan view for a principal part showing an outline of the digital broadcast receiving tuner according to the present invention, and FIG. 4 is an enlarged bottom view for a principal part showing an outline of the digital broadcast receiving tuner according to the present invention.

Next, a description will be made of the structure of the digital broadcast receiving tuner according to the present invention by exemplifying a tuner for use with, for example, a television set with a VCR. As shown in the block diagram of FIG. 1, the digital broadcast receiving tuner has two tuners of a first tuner T1 for a television and a second tuner T2 for a VCR, and the respective first and second tuners T1 and T2 are composed of filters F1 and F2, direct conversion units H1 and H2, each including an oscillator and a mixer, and demodulation units D1 and D2.

Thus, an inputted signal is distributed to the first and second tuners T1 and T2 by a distributor B, and in the first tuner T1 for a television, the signal is adapted to be transmitted to the demodulation unit D1 through the filter F1 and the direct converter H1, and in the second tuner T2 for a VCR, the signal is adapted to be transmitted to the demodulation unit D2 through the filter F2 and the direct converter H2.

Also, each of these first and second tuners T1 and T2 is structured of a high-frequency region R1 consisting of the distributor B, the filters F1 and F2 and the direct converters H1 and H2, and a demodulation unit region R2 consisting of the demodulation units D1 and D2.

FIGS. 2 to 4 show a digital broadcast receiving tuner according to the present invention, structured in a state in which the distributor B in the block diagram of FIG. 1 is excluded.

Next, with reference to FIGS. 2 to 4, a description will be made of the structure of the digital broadcast receiving tuner according to the present invention. An insulating board 1, which is a circuit board, is a multi-layer board formed by stacking a plurality (three layers in this case) of boards 1a, 1b and 1c (see FIG. 2), and on both surfaces, namely, a surface and a back surface exposed of this insulating board 1, there are provided wiring patterns 2a (see FIGS. 2 and 3) and 2b (see FIGS. 2 and 4).

Thus, on one surface side, which is the surface of this insulating board 1, there is formed the first tuner T1 (see FIGS. 2 and 3) for a television, and on the other surface side, which is the back surface, there is formed the second tuner T2 (see FIGS. 2 and 4) for a VCR.

This first tuner T1 for a television is, as shown in FIGS. 2 and 3, structured such that in the high-frequency unit region R1 of the insulating board 1, there are arranged the filter F1 and the IC component 3a having the direct conversion unit H1 including the oscillator and the mixer, and that in the demodulation unit region R2, there is arranged the IC component 4a having the demodulation unit D1.

Also, the second tuner T2 for a VCR is, as shown in FIGS. 2 and 4, structured such that in the high-frequency unit region R1 of the insulating board 1, there are arranged the filter F2 and the IC component 3b having the direct conversion unit H2 including the oscillator and the mixer, and that in the demodulation unit region R2, there is arranged the IC component 4b having the demodulation unit D2.

The first and second tuners T1 and T2 are structured such that the high-frequency unit region R1 of the first tuner T1 and the demodulation unit region R2 of the second tuner T2, and the demodulation unit region R2 of the first tuner T1 and the high-frequency unit region R1 of the second tuner T2 are arranged at a position opposite to each other with the insulating board 1, which is the multi-layer board, interposed therebetween respectively.

Also, as shown in FIG. 2, between the lamination layers of the insulating board 1 formed into three layers by the boards 1a, 1b and 1c, there are provided two grounding conductor layers 5 and 6, and the grounding conductor layer 5 provided between the board 1a and the board 1b is provided near the first tuner T1 side, while the grounding conductor layer 6 provided between the board 1b and the board 1c is provided near the second tuner T2 side.

These grounding conductor layers 5 and 6 electrically shield between the first tuner T1 and the second tuner T2.

Also, the grounding conductor layer 5 is, as shown in FIG. 2, structured such that there is provided a first remainder 5a on the demodulation unit region R2 side; the high-frequency unit region R1 is provided with a deletion unit (i.e. a non-conductive portion) 5b; and there is further provided a second remainder 5c to oppose to the lower portion of the IC component 3a having the direct conversion unit H1.

Also, the grounding conductor layer 6 is, as shown in FIG. 2, structured such that there is provided a first remainder 6a on the demodulation unit region R2 side; the high-frequency unit region R1 is provided with a deletion unit 6b; and there is further provided a second remainder 6c to oppose to the lower portion of the IC component 3b having the direct conversion unit H2.

Thus, although not shown here, the structure is arranged such that the second remainder 5c is connected to the first remainder 6a, and the second remainder 6c is connected to the first remainder 5a, through a connecting conductor, with which the through-hole is filled, or the like.

Particularly, in the high-frequency unit of the first tuner T1 for a television having such a structure, the deletion unit 5b is provided whereby capacitance between the wiring pattern 2a and the grounding conductor layer 6 is reduced to improve the performance of the first tuner T1, and the first remainders 5a and 6a of the grounding conductor layers 5 and 6 electrically shield between the first and second tuners T1 and T2.

Also, the IC component 3a is structured so as to incorporate a wiring portion (not shown) by an exterior portion (not shown) made of synthetic resin or the like. When this IC component 3a is connected to the wiring pattern 2a, the wiring portion of the IC component 3a is separated from the surface of the insulating board 1 so that the second remainder 5c located at the lower portion of the IC component 3a opposes to the wiring portion of the IC component 3a located at a more distant position than the wiring pattern 2a.

In the first tuner T1 for a television, therefore, the capacitance between the first tuner T1 and the remainder 5c is small; the influence on the performance can be reduced; the distance between the second remainder 5c and the wiring pattern 2a can be shortened; and a grounding connection of the circuit in the high-frequency unit can be shortened, thus making it possible to ensure the grounding effect.

Also, particularly, in the high-frequency unit of the second tuner T2 for a VCR, the deletion unit 6b is provided whereby capacitance between the wiring pattern 2b and the grounding conductor layer 5 is reduced to improve the performance of the second tuner T2; and the IC component 3b is, as in the case of the IC component 3a, structured so as to incorporate a wiring portion (not shown) by an exterior portion (not shown) made of synthetic resin or the like. When this IC component 3b is connected to the wiring pattern 2b, the wiring portion of the IC component 3b is separated from the surface of the insulating board 1 so that the second remainder 6c located at the lower portion of the IC component 3b opposes to the wiring portion of the IC component 3b located at a more distant position than the wiring pattern 2b.

In the second tuner T2 for a VCR, therefore, the capacitance between the second tuner T2 and the remainder 6c is small; the influence on the performance can be reduced; the distance between the second remainder 6c and the wiring pattern 2b can be shortened; and the grounding connection of the circuit in the high-frequency unit can be shortened, thus making it possible to ensure the grounding effect.

In this respect, in the above-described embodiment, the description has been made of an embodiment in which no distributor B is provided, but this distributor B may be provided on the insulating board 1.

According to the present invention, it is possible to provide a lower-priced digital broadcast receiving tuner having higher productivity as well as a lower number of components than a conventional tuner because, on one surface of the insulating board 1, there is formed the first tuner T1 while, on the other surface thereof, there is formed the second tuner T2, and therefore a single insulating board 1 can be shared.

Also, when mounting the digital broadcast receiving tuner according to the present invention onto a mother board, the occupied area can be made smaller and a smaller-sized tuner can be obtained than the conventional one.

Also, since the insulating board 1 is structured of a stacked multi-layer board, and the first and second tuners T1 and T2 are electrically shielded from each other by the grounding conductor layers 5 and 6 provided within this multi-layer board, it is possible to provide a digital broadcast receiving tuner having good performance.

Also, since a structure is arranged such that the first and second tuners T1 and T2 have a high-frequency unit and a demodulation unit respectively, and the high-frequency unit of the first tuner T1 and the demodulation unit of the second tuner T2, and the demodulation unit of the first tuner T1 and the high-frequency unit of the second tuner T2 are arranged at a position opposite to each other with the multi-layer board interposed therebetween respectively, it is possible to keep a large distance between the high-frequency unit of the first tuner T1 from that of the second tuner T2. This decreases the interference with each other, thus making it possible to provide a digital broadcast receiving tuner with good performance.

Also, the multi-layer board is formed of at least three layers; between the lamination layers, there are provided at least two grounding conductor layers 5 and 6; in a region R1 in which the high-frequency unit is proved, the grounding conductor layers 5 and 6 arranged near the high-frequency unit are provided with deletion units 5b and 6b; and in a region R2 in which the demodulation unit is provided, the grounding conductor layers 5 and 6 arranged near the demodulation unit are provided with first remainders 5a and 6a to increase a facing distance between the wiring patterns 2a and 2b of the high-frequency unit and the first remainders 5a and 6a, and therefore, the capacitance between the wiring patterns 2a and 2b and the grounding conductor layers 5 and 6 can be reduced to thereby enhance the performance of the first and second tuners T1 and T2.

In addition, the high-frequency unit has IC components 3a and 3b, each having a direct conversion unit including an oscillator and a mixer, and the grounding conductor layer 5, 6 arranged near the high-frequency unit is provided with a second remainder 5c, 6c to oppose the lower portion of the IC component 3a, 3b. Therefore, the capacitance between the IC component 3a, 3b and the remainder 6c is small; the influence on the performance can be reduced; the distance between the second remainder 5c, 6c and the wiring pattern 2a, 2b can be shortened; and the grounding connection of the circuit in the high-frequency unit can be shortened, thus making it possible to ensure the grounding effect.

What is claimed is:

1. A digital broadcast receiving tuner comprising:
   an insulating board having a first surface and a second surface;
   a first wiring pattern disposed on the first surface and a second wiring pattern disposed on the second surface; and
   a first tuner disposed on the first surface and a second tuner disposed on the second surface,
   wherein the first and second tuners each comprise a respective high-frequency unit and a corresponding demodulation unit.

2. The digital broadcast receiving tuner according to claim 1, wherein the insulating board further comprises a stacked multi-layer board, and the first and second tuners are electrically shielded from each other by a grounding conductor layer provided within the multi-layer board.

3. The digital broadcast receiving tuner according to claim 2, wherein the high-frequency unit of the first tuner and the demodulation unit of the second tuner are arranged at a first position opposite to each other with the multi-layer board interposed therebetween, and the demodulation unit of the first tuner and the high-frequency unit of the second tuner are arranged at a second position opposite to each other with the multi-layer board interposed therebetween.

4. The digital broadcast receiving tuner according to claim 3, wherein:
   the multi-layer board comprises at least the-two-a first grounding conductor layer and a second grounding conductor layers between lamination layers,
   the first grounding conductive layer is more proximate to the first tuner than the second grounding conductive layer,
   each grounding conductive layer has respective deletion units and a corresponding first remainder,
   the deletion units of the first grounding conductive layer and the first remainder of the second grounding conductive layer are arranged at the first position, and the deletion units of the second grounding conductive layer and the first remainder of the first grounding conductive layer are arranged at the second position, and
   the deletion units of the first grounding conductive layer are arranged more proximate to the high-frequency unit of the first tuner than the first remainder of the second grounding conductive layer and the deletion units of the second grounding conductive layer are arranged more proximate to the high-frequency unit of the second tuner than the first remainder of the first grounding conductive layer to thereby increase a facing distance between the respective wiring patterns and the corresponding first remainder.

5. The digital broadcast receiving tuner according to claim 4, wherein each high-frequency unit comprises an IC component having a direct conversion unit including an oscillator and a mixer, and each grounding conductor layer has a second remainder that opposes a lower portion of the corresponding IC component.

6. The digital broadcast receiving tuner according to claim 5, wherein the second remainder of each grounding conductor layer is disposed between deletion units of the corresponding grounding conductor layer.

* * * * *

UNITED STATES PATENT AND TRADEMARK OFFICE
CERTIFICATE OF CORRECTION

PATENT NO. : 6,737,945 B2 Page 1 of 1
APPLICATION NO. : 10/001624
DATED : May 18, 2004
INVENTOR(S) : Satoshi Kawai It is certified that error appears in the above-identified patent and that said Letters Patent is hereby corrected as shown below:

On the Title Page

Item (54), line 3, after "TUNER UNITS ON" delete "OPPOS" and substitute --OPPOSITE-- in its place.

Column 1, in the title, line 3, after "TUNER UNITS ON" delete "OPPOS" and substitute --OPPOSITE-- in its place.

Col. 6, in claim 4, line 3, delete "the-two-a first" and substitute --a first-- in its place.

Col. 6, in claim 5, lines 3 and 4, delete "including an oscillator and a mixer,".

Signed and Sealed this

Tenth Day of April, 2007

JON W. DUDAS
*Director of the United States Patent and Trademark Office*